(12) United States Patent
Zhu et al.

(10) Patent No.: US 8,674,449 B2
(45) Date of Patent: Mar. 18, 2014

(54) SEMICONDUCTOR DEVICE AND METHOD FOR MANUFACTURING THE SAME

(75) Inventors: Huilong Zhu, Poughkeepsie, NY (US); Zhijiong Luo, Poughkeepsie, NY (US); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/576,550

(22) PCT Filed: Nov. 25, 2011

(86) PCT No.: PCT/CN2011/082930
§ 371 (c)(1),
(2), (4) Date: Aug. 1, 2012

(87) PCT Pub. No.: WO2013/033956
PCT Pub. Date: Mar. 14, 2013

(65) Prior Publication Data
US 2013/0062699 A1    Mar. 14, 2013

(30) Foreign Application Priority Data
Sep. 8, 2011 (CN) .......................... 2011 1 0265211

(51) Int. Cl.
*H01L 21/70* (2006.01)
*H01L 27/088* (2006.01)

(52) U.S. Cl.
USPC .................. 257/368; 257/401; 257/E29.022; 257/E29.04; 257/E29.113; 257/E21.409; 438/294

(58) Field of Classification Search
USPC .................... 257/401, 368, E29.113, E29.04, 257/E29.022, E21.409; 438/294
See application file for complete search history.

(56) References Cited

U.S. PATENT DOCUMENTS

| | | | |
|---|---|---|---|
| 8,609,497 B2* | 12/2013 | Chung et al. | 438/299 |
| 2006/0170053 A1 | 8/2006 | Yeo et al. | |
| 2008/0230852 A1* | 9/2008 | Yu et al. | 257/401 |
| 2008/0265338 A1* | 10/2008 | Yu et al. | 257/397 |
| 2011/0147711 A1* | 6/2011 | Pillarisetty et al. | 257/24 |
| 2012/0091528 A1* | 4/2012 | Chang et al. | 257/347 |
| 2013/0011975 A1* | 1/2013 | Cheng et al. | 438/151 |
| 2013/0032783 A1* | 2/2013 | Pillarisetty et al. | 257/24 |
| 2013/0249004 A1* | 9/2013 | Doris et al. | 257/350 |

FOREIGN PATENT DOCUMENTS

| | | |
|---|---|---|
| CN | 1534745 A | 10/2004 |
| CN | 1551368 A | 12/2004 |

OTHER PUBLICATIONS

Inernational Search Report from PCT/CN2011/082930 dated Jun. 14, 2012 (5 pages).
Written Opinion from PCT/CN2011/082930 dated Jun. 14, 2012 (4 pages).

* cited by examiner

Primary Examiner — Victor A Mandala
(74) Attorney, Agent, or Firm — Osha Liang LLP

(57) ABSTRACT

A semiconductor device and a method for manufacturing the same are disclosed. In one embodiment, the semiconductor device may comprise a semiconductor layer, a fin formed by patterning the semiconductor layer, and a gate stack crossing over the fin. The fin may comprise a doped block region at the bottom portion thereof. According to the embodiment, it is possible to effectively suppress current leakage at the bottom portion of the fin by the block region.

13 Claims, 8 Drawing Sheets

SEMICONDUCTOR DEVICE AND METHOD FOR MANUFACTURING THE SAME

CROSS REFERENCE TO RELEVANT APPLICATION(S)

This application claims priority to Chinese Application No. 201110265211.4, entitled "SEMICONDUCTOR DEVICE AND METHOD FOR MANUFACTURING THE SAME", filed on Sep. 8, 2011, which is incorporated herein by reference in its entirety.

TECHNICAL FIELD

The present disclosure relates to the field of semiconductor devices, and more particularly, to a semiconductor device and a method for manufacturing the same, by which it is possible to reduce current leakage at the bottom portion of a fin.

BACKGROUND

Fin Field Effect Transistors (FinFETs) are becoming increasingly attractive due to their good control of short channel effects. FIG. 1 is a perspective view schematically showing a FinFET by way of example. As shown in FIG. 1, the FinFET comprises a bulk Si substrate 100, a fin 101 formed on the bulk Si substrate 100, a gate stack 102 crossing over the fin 101 and including, for example, a gate dielectric layer and a gate electrode layer (not shown), and an isolation layer (e.g., $SiO_2$) 103. In this FinFET, under the control of the gate electrode, conductive channels are formed in the fin 101, and specifically, in three side surfaces (i.e., a left side surface, a right side surface and a top side surface as shown in the figure) of the fin 101. That is, a portion of the fin 101 under the gate electrode serves as a channel region, and source and drain regions are located at either sides of the channel region, respectively.

In the example shown in FIG. 1, the FinFET is formed on the bulk semiconductor substrate. Alternatively, a FinFET can be formed on other types of substrate, such as a Semiconductor On Insulator (SOI) substrate. Furthermore, the FinFET shown in FIG. 1 has the channel formed in all the three side surfaces of the fin 101, and thus is referred to as a 3-gate FinFET. On the other hand, a 2-gate FinFET can be formed by, for example, providing an isolation layer (e.g., nitride) between the top surface of the fin 101 and the gate stack 102, in which case the top surface of the fin 101 will not be subject to the control of the gate electrode and thus will have no channel formed therein.

However, as shown in FIG. 1, the bottom portion of the fin is surrounded by the isolation layer of $SiO_2$ 103, and thus cannot be effectively controlled by the gate electrode. Thus, there may be a current path between the source and drain regions through the bottom portion of the fin even in the off state, resulting in current leakage.

Therefore, there is a need for a semiconductor device and a method for manufacturing the same, by which it is possible to effectively reduce the current leakage at the bottom portion of the fin.

SUMMARY

The present disclosure provides, among other things, a semiconductor device and a method for manufacturing the same.

According to an embodiment, there is provided a semiconductor device, comprising: a semiconductor layer; a fin formed by patterning the semiconductor layer; and a gate stack crossing over the fin, wherein the fin comprises a doped block region at the bottom portion thereof. Preferably, the block region comprises n-type dopants for a p-type device, and p-type dopants for an n-type device.

Here, there may be several fins of different heights. These fins of different heights may be achieved by, for example, etching the semiconductor layer to different depths. To well control the etching depths, the semiconductor layer may comprise a stack of relatively thicker fin main-body sub-layers and relatively thinner etching-stop sub-layers, which are arranged alternately.

According to a further embodiment, there is provided a method for manufacturing a semiconductor device, the method comprising: patterning a semiconductor layer to form a fin; forming a doped block region at the bottom portion of the fin; and forming a gate stack crossing over the fin.

Preferably, forming the doped block region at the bottom portion of the fin may comprise: implanting dopants into the semiconductor layer on both sides of the fin; and annealing to activate the implanted dopants so that the dopants diffuse into the bottom portion of the fin.

According to some embodiments, it is possible to effectively suppress current leakage between source and drain regions through the bottom portion of fin by a block region formed at the bottom portion of the fin. Further, it is possible to provide fins of different heights by etching a semiconductor layer to different depths. As a result, it is possible to provide channels of different widths and thus to provide devices of different drive capabilities.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
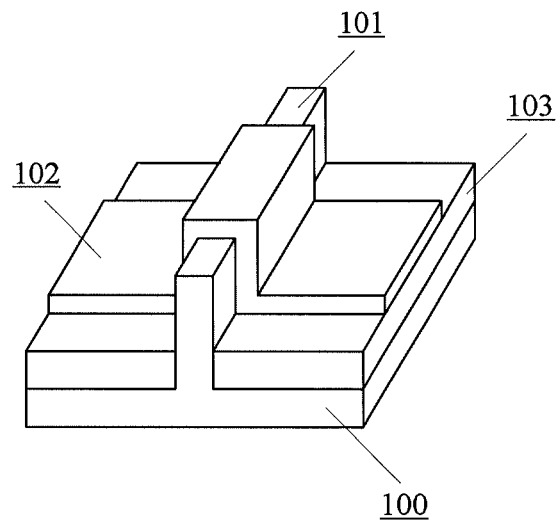
FIG. 1 is a perspective view schematically showing a conventional FinFET.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structural views and sectional views according to the embodiments are shown. However, they are not drawn to scale, and some features may be enlarged while some features may be omitted for sake of clarity. Moreover, shapes, sizes, and relative positions of regions and layers shown in the drawings are also illustrative, and deviations may occur due to manufacture tolerances and technique limitations in practice. Those skilled in the art can also devise regions/layers of other different shapes, sizes, and relative positions as desired.

Figure 2:
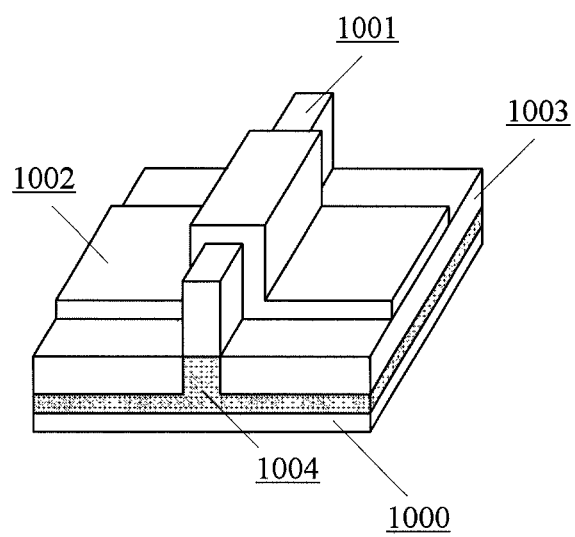
FIG. 2 is a perspective view schematically showing a semiconductor device according to an embodiment of the present disclosure.

FIG. 2 is a perspective view schematically showing a semiconductor device according to an embodiment of the present disclosure. As shown in FIG. 2, the semiconductor device may comprise a semiconductor layer 1000, a fin 1001 formed in the semiconductor layer 1000 and abutting against the semiconductor layer 1000, and a gate stack 1002 crossing over the fin 1001. The fin 1001 can comprise a doped block region 1004 at the bottom portion thereof, to at least partially block current leakage.

For example, the semiconductor layer 1000 may comprise a semiconductor substrate of a bulk semiconductor material, or a semiconductor layer provided on a substrate such as a SOI substrate. The semiconductor layer 1000 may comprise any suitable semiconductor material such as Si, Ge, SiGe, III-V group compound semiconductor materials, and the like. As will be described in the following, the semiconductor layer 1000 may comprise a stack of several semiconductor sub-layers.

The fin 1001 may be formed by patterning the semiconductor layer 1000. For example, a patterned mask (e.g., a photo resist layer or a hard mask) may be applied onto the semiconductor layer 1000 to cover a region corresponding to the fin 1001, and then the semiconductor layer 1000 is etched, to form the fin 1001.

The gate stack 1002 may comprise a gate dielectric layer such as $SiO_2$ and a gate electrode layer such as poly silicon. Preferably, the gate dielectric layer can comprise high-K dielectric such as $HfO_2$, HfSiO, HfSiON, HfTaO, HfTiO, HfZrO, $Al_2O_3$, $La_2O_3$, $ZrO_2$, LaAlO, and the like, and the gate electrode layer can comprise a metal gate electrode such as Ti, Co, Ni, Al, W, and the like. More preferably, there may be a work function adjustment layer interposed between the gate dielectric layer and the gate electrode layer. For example, the work function adjustment layer may comprise TiN, TiAlN, TaN, TaAlN, TaC, and the like.

According to an embodiment, the block region 104 may comprise dopants opposite in conductivity type to the device. Specifically, for a p-type device, the block region 104 may comprise n-type dopants, while for an n-type device, the block region 104 may comprise p-type dopants. In FIG. 2, the block region 104 is shown to have straight and definite boundaries. However, in practice the block region 104 may have boundaries which are not sharp due to diffusion of the dopants.

The semiconductor device may further comprise an isolation layer 1003 made of dielectric such as $SiO_2$ on both sides of the fin 1001 on the semiconductor layer 1000, to isolate the gate stack 1002 from the semiconductor layer 1000. As stated in the background, due to the presence of the isolation layer 1003, the gate electrode cannot effectively control the bottom portion of the fin 1001, especially the portion corresponding to the thickness of the isolation layer 1003. To avoid this adverse effect at least partially, the top surface of the block region 104 can be set to protrude with respect to the top surface of the isolation layer 1003, so that the gate electrode can control the fin more effectively. It is to be noted that the top surfaces of those two are shown in the figure to be aligned with each other for convenience of illustration, although the top surface of the block region 1004 is preferably set to protrude with respect to the top surface of the isolation layer 1003 as described above.

Next, an example method for manufacturing the semiconductor device shown in FIG. 2 will be described with reference to FIG. 3. The following descriptions are given with respect to Si based materials, by way of example. However, it is to be understood that the present disclosure is not limited to the Si based materials, but is also applicable to other semiconductor materials.

Figure 3A:
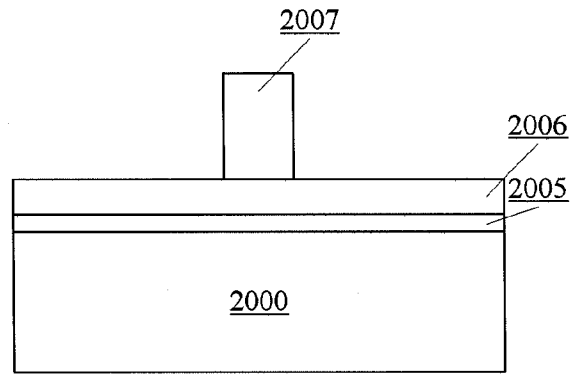
FIGS. 3(a)-3(h) are sectional views schematically showing structures obtained in different steps in a flow of manufacturing a semiconductor device according to an embodiment of the present disclosure.

As shown in FIG. 3(a), a bulk Si semiconductor layer 2000 is provided, and an oxide layer (e.g. silicon oxide) 2005 and a nitride layer (e.g., silicon nitride) 2006 are formed sequentially thereon. For example, the oxide layer 2005 may have a thickness of about 2-5 nm, and the nitride layer 2006 may have a thickness of about 10-50 nm. The oxide layer 2005 and the nitride layer 2006 can serve as a hard mask in subsequent processes. Further, a patterned photo resist layer 2007 can be formed on the nitride layer 2006 so that it is positioned on a region where a fin is to be formed.

Figure 3B:
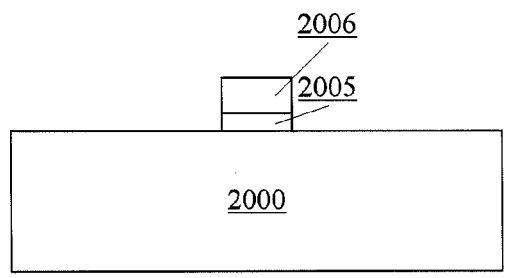

Then, as shown in FIG. 3(b), the hard mask layer (including the nitride layer 2006 and the oxide layer 2005) can be patterned. Specifically, the nitride layer 2006 may be etched by means of, for example, Reactive Ion Etching (RIE), by using the patterned photo resist layer 2007 as a mask. The etching can be stopped on the oxide layer 2005. After that, the oxide layer 2005 is further etched by means of, for example, RIE. The etching can be stopped on the Si semiconductor layer 2000. This results in the patterned hard mask layer 2005, 2006. Finally, the photo resist layer 2007 can be removed.

Figure 3C:
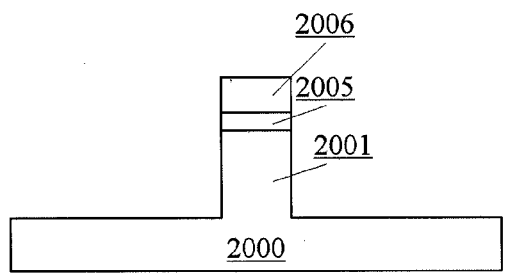

Next, as shown in FIG. 3(c), the semiconductor layer 2000 can be patterned by means of, for example, RIE by using the patterned hard mask layer 2005, 2006 as a mask, resulting in a fin 2001 in the semiconductor layer 2000. Here, the height of the formed fin 2001 can be controlled by parameters in the RIE process such as etching time and the like.

It is to be noted that the formation of the fin can be done in various ways in the art, and is not limited to that described above.

Figure 3D:
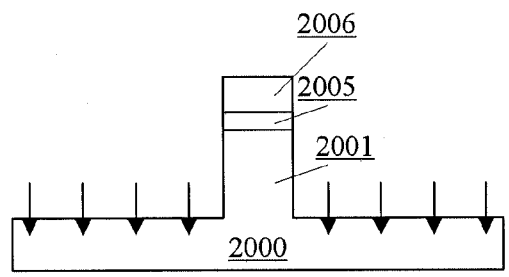

After the formation of the fin, ion implantation can be conducted as shown in FIG. 3(d), to implant dopants for formation of a block region into the semiconductor layer 2000. Preferably, the implanted dopants can be of n-type for a p-type device, while p-type for an n-type device. The implantation can be conducted in a direction vertical to the surface of the semiconductor layer. Due to the presence of the hard mask layer 2005, 2006 on the top of the fin 2001, the vertical implantation will not cause the dopants implanted into the fin 2001. Here, the implantation depth of the dopants into the semiconductor layer 2000 can be controlled by parameters in the implantation process such as implanting energy, time, dose and the like.

Figure 3E:
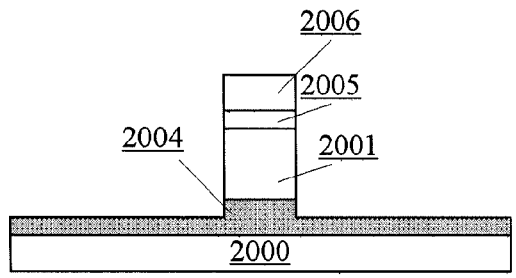

Subsequently, as shown in FIG. 3(e), the implanted dopants can be activated by means of annealing, so that the dopants can diffuse into the bottom portion of the fin 2001, resulting in a block region 2004. The obtained block region may have a doping concentration of about $1*10^{16}$ cm$^{-3}$-$1*10^{19}$ cm$^{-3}$. It is also to be noted that the block region 2004 may have boundaries which are not sharp. In the figure, the block region 2004 is shown to have straight and definite boundaries for convenience.

Figure 3F:
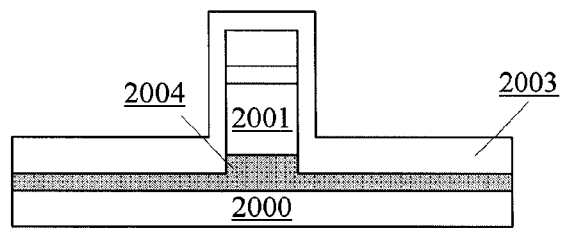
Figure 3G:
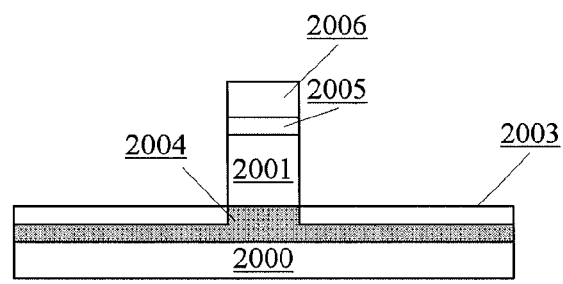

Next, as shown in FIGS. 3(f) and 3(g), an isolation layer may be formed on both sides of the fin 2001 on the semiconductor layer 2000. Specifically, as shown in FIG. 3(f), firstly on the whole structure an oxide layer 2003, such as a High Density Plasma (HDP) oxide (e.g., $SiO_2$) layer, may be deposited. The oxide layer 2003 may have its bottom portion thicker and have portions on sidewalls of the fin 2001 thinner. Then, as shown in FIG. 3(g), the oxide layer 2003 is isotropically etched back to expose the sidewalls of the fin 2001, resulting in the isolation layer 2003. Preferably, the top surface of the block region 2004 protrudes with respect to the top surface of the isolation layer 2003 as described above.

Figure 3H:
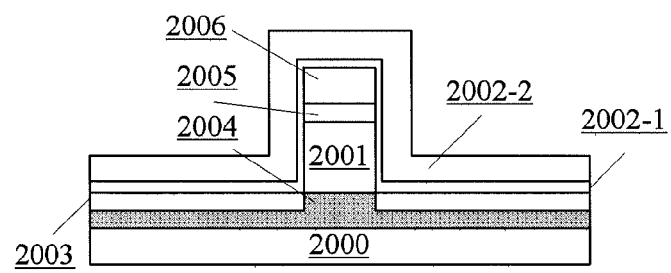

Then, as shown in FIG. 3(h), a gate dielectric layer 2002-1 and a gate electrode layer 2002-2 can be formed, which constitute a gate stack, to cross over the fin 2001. After that, the process can proceed as in the conventional process for formation of source and drain regions, metal interconnection, and the like, to obtain a final device.

Thus, the semiconductor device according to this embodiment is achieved. This semiconductor device is similar in perspective view to that shown in FIG. 2 (where the specific configuration of the gate stack and also the hard mask layer are not shown).

The hard mask layer 2005, 2006 can be remained. Or otherwise, they can be removed before the formation of the gate stack, which will result in a 3-gate device.

Figure 4:
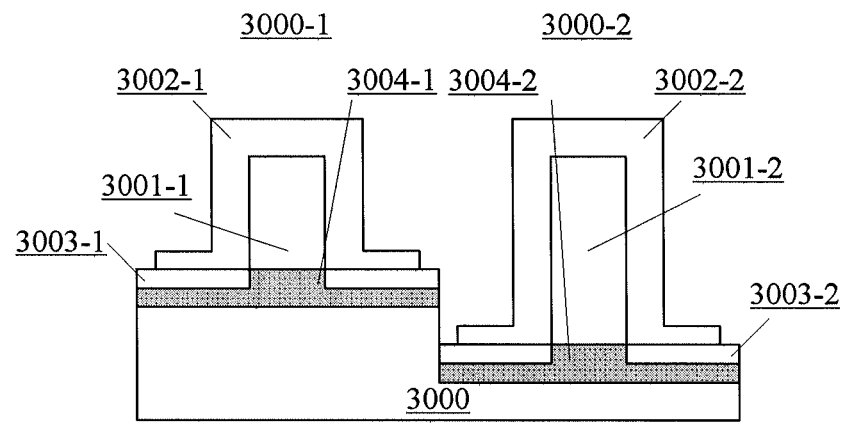
FIG. 4 is a sectional view schematically showing a semiconductor device according to a further embodiment of the present disclosure.

FIG. 4 is a sectional view schematically showing a semiconductor device according to a further embodiment of the present disclosure. According to this embodiment, the device may incorporate fins of different heights in addition to block regions at the bottom portions of the respective fins.

Specifically, as shown in FIG. 4, the semiconductor device comprises a semiconductor layer 3000 including a first region 3000-1 and a second region 3000-2. The first and second regions each may comprise a structure similar to that shown in FIG. 3(h) formed therein, but with fins of different heights. More specifically, the first region 3000-1 may comprise a fin 3001-1 (with or without a hard mask layer on the top thereof), a gate stack 3002-1 (the specific configuration of which, such as a gate dielectric layer and a gate electrode layer, is not shown in the figure) crossing over the fin 3001-1, an isolation layer 3003-1, and a block region 3004-1 at the bottom portion of the fin. Likewise, the second region 3000-2 may comprise a fin 3001-2 (with or without a hard mask layer on the top thereof), a gate stack 3002-2 (the specific configuration of which, such as a gate dielectric layer and a gate electrode layer, is not shown in the figure) crossing over the fin 3001-2, an isolation layer 3003-2, and a block region 3004-2 at the bottom portion of the fin. The fins 3001-1 and 3001-2 have their top surfaces flush with each other, but have different heights different from each other.

Here, it is to be noted that in the context of the present disclosure a "height" of a fin refers to an extent from a top surface of the fin to a bottom surface of the fin (that is, a surface of the semiconductor layer against which the fin abuts). For example, in the example shown in FIG. 4, the fin in the first region 3000-1 has a height being equal to the extent from the top surface of the fin 3001-1 to a surface (corresponding to the bottom surface of the isolation layer 3003-1 in the example of FIG. 4) of portions of the semiconductor layer 3000 other than the fin in the first region, and the fin in the second region 3000-2 has a height being equal to the extent from the top surface of the fin 3001-2 to a surface (corresponding to the bottom surface of the isolation layer 3003-2 in the example of FIG. 4) of portions of the semiconductor layer 3000 other than the fin in the second region.

Here, the term "abut against" or "abutting against" refers to that the fin directly contacts the semiconductor layer, without any intervening layers. There may also be such a situation that the semiconductor layer has an underlying layer such as a substrate. In this situation, a fin can extend through the whole semiconductor layer (that is, the semiconductor layer is adopted in its entire thickness to form the fin having such a thickness). Then, the bottom surface of the fin will overlap with the bottom surface of the semiconductor layer. In the context of the present disclosure, this situation is also considered as that the fin "abuts against" the semiconductor layer because there is no intervening layer between the fin and the semiconductor layer.

The semiconductor device shown in FIG. 4 may be manufactured by following processes, for example.

Firstly, similar to the processes shown in FIGS. 3(a) and 3(b), a patterned hard mask layer may be formed on the semiconductor layer 3000. Here, the patterned hard mask layer may have portions corresponding to the fins to be formed in the first region 3000-1 and the second region 3000-2.

Then, similar to the process shown in FIG. 3(c), the semiconductor layer 3000 is patterned by means of, for example, RIE by using the patterned hard mask layer as a mask. When the RIE has been conducted to achieve the first fin 3001-1 in the first region 3000-1, the first region 3000-1 can be covered by a protection layer such as a photo resist layer. Then, the RIE continues in the second region 3000-2 to achieve the second fin 3001-2. After that, the protection layer can be removed from the first region 3000-1.

Subsequently, the process can proceed as shown in FIGS. 3(d)-3(h), which is omitted here.

According to the embodiment of the present disclosure, the semiconductor layer can be patterned in such a manner that in the first region 3000-1 the portions of the semiconductor layer other than the fin are recessed with respect to the fin by a depth (referred to as "a first depth" hereinafter), and in the second region 3000-2 the portions of the semiconductor layer other than the fin are recessed with respect to the fin by a further depth (referred to as "a second depth" hereinafter). It is possible to provide the fins of different heights respectively in the first and second regions by making the recess depths in the first and second regions different from each other (that is, making the first depth different from the second depth). The heights of the fins correspond to the first depth and the second depth, respectively.

In this embodiment, the arrangement where two fins of different heights is illustrated. However, the present disclosure is not limited thereto. An arrangement where any number of fins of different heights is also feasible.

Figure 5:
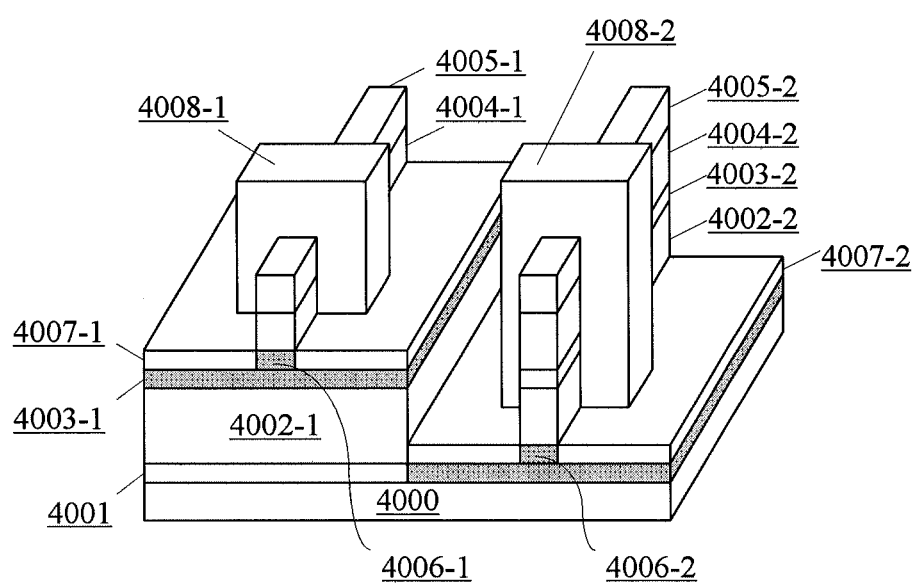
FIG. 5 is a perspective view schematically showing a semiconductor device according to a still further embodiment of the present disclosure.

FIG. 5 is a perspective view schematically showing a semiconductor device according to a further embodiment of the present disclosure. The semiconductor device according to this embodiment is substantially same as that shown in FIG. 4, except that the semiconductor layer comprises a plurality of semiconductor sub-layers.

Specifically, as shown in FIG. 5, the semiconductor device comprises a substrate 4000 such as a bulk Si substrate, and a semiconductor layer formed thereon including semiconductor sub-layers 4001, 4002-1 and 4002-2, 4003-1 and 4003-2, and 4004-1 and 4004-2, which are arranged on top of each other. For example, the semiconductor sub-layer 4001 may comprise SiGe (where the atomic percentage of Ge may be about 5-20%) with a thickness of about 2-15 nm, the semiconductor sub-layer 4002-1, 4002-2 may comprise Si with a thickness of about 20-150 nm, the semiconductor sub-layer 4003-1, 4003-2 may comprise SiGe (where the atomic percentage of Ge may be about 5-20%) with a thickness of about 1-10 nm, and the semiconductor sub-layer 4004-1, 4004-2 may comprise Si with a thickness of about 20-150 nm.

Fins can be formed by patterning those semiconductor sub-layers. Specifically, the fin on the left side as shown in FIG. 5 consists of the patterned semiconductor sub-layer 4004-1, and the fin on the right side as shown in FIG. 5 consists of the patterned semiconductor layers 4002-2, 4003-2, and 4004-2. There are also block regions 4006-1 and 4006-2 at bottom portions of the respective fins. It is to be noted that the block regions 4006-1 and 4006-2 may have boundaries which are not sharp. In the figure, some boundaries of the block regions 4006-1 and 4006-2 are shown to overlap with boundaries of the semiconductor sub-layers 4003-1 and 4001 just for convenience. The present disclosure is not limited thereto.

In FIG. 5, hard mask layers 4005-1 and 4005-2 are also shown on top of the fins. It is to be understood by those skilled in the art that they are not necessary.

The semiconductor device further comprises gate stacks 4008-1 and 4008-2 (specific configuration of which, such as a gate dielectric layer and a gate electrode layer, is not shown) crossing over the respective fins. The gate stacks may be separated from the semiconductor layer by isolation layers 4007-1 and 4007-2. According to an embodiment, the block regions 4006-1 and 4006-2 may have their top surfaces protruding with respect to those of the respective isolation layers 4007-1 and 4007-2.

Also, in this embodiment the fin in the left region ("a first region") and the fin in the right region ("a second region") have different heights from each other. It is to be noted that in the context of the present disclosure a "height" of a fin refers to an extent from a top surface of the fin to a bottom surface of the fin (that is, a surface of the semiconductor layer against which the fin abuts). For example, in the example shown in FIG. 5, the fin in the first region has a height being equal to the extent from the top surface of the semiconductor sub-layer 4004-1 (i.e., the top surface of the fin in the first region) to the top surface of the semiconductor sub-layer 4003-1 (i.e., a surface of the portions of the semiconductor layer other than the fin in the first region), and the fin in the second region has a height being equal to the extent from the top surface of the semiconductor sub-layer 4004-2 (i.e., the top surface of the fin in the second region) to the top surface of the semiconductor sub-layer 4001 (i.e., a surface of the portions of the semiconductor layer other than the fin in the second region).

In this embodiment, the semiconductor layer comprises a plurality of semiconductor sub-layers, for example, a stack of alternating SiGe sub-layers and Si sub-layers as described above. The semiconductor sub-layers can be selected so that semiconductor sub-layers adjacent to each other comprise different materials from each other and have etching selectively with respect to each other. As a result, the semiconductor sub-layers can be selectively etched on a sub-layer by sub-layer basis. Thus, in patterning a fin, it is possible to have the fin formed of a well controlled number of the semiconductor sub-layers, and thus have a well controlled height (i.e., a well controlled channel width of a final device).

According to an embodiment, the semiconductor layer may comprise a stack of relatively thicker fin main-body sub-layers and relatively thinner etching-stop sub-layers which are arranged alternately. For example, in the above example, the semiconductor sub-layers 4002-1 and 4002-2, and 4004-1 and 4004-2, which are relatively thicker, serve as the fin main-body sub-layers (e.g., Si in this example), and the semiconductor sub-layers 4001, and 4003-1 and 4003-2, which are relatively thinner, serve as the etching-stop sub-layers (e.g., SiGe in this example) with respect to the fin main-body sub-layers. In this way, by alternating the fin main-body sub-layers and the etching-stop sub-layers, etching of the respective fin main-body sub-layers can be stopped substantially precisely on the respective etching-stop sub-layers. Thus, in patterning a fin, it is possible to well control the number of the fin main-body sub-layers which dominantly determine the height of the fin.

Hereinafter, an example method for manufacturing the semiconductor device shown in FIG. 5 will be described with reference to FIG. 6. The following descriptions are given with respect to Si based materials, by way of example. However, it is to be understood that the present disclosure is not limited to the Si based materials, but is also applicable to other semiconductor materials.

Figure 6A:
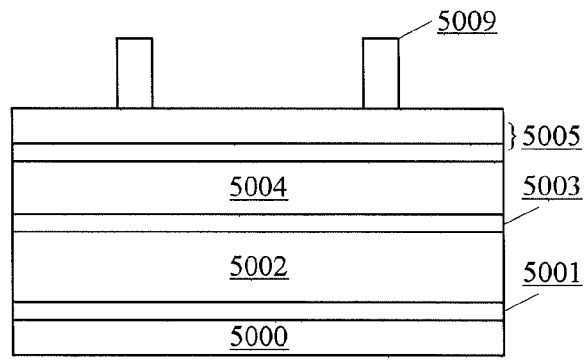
FIGS. 6(a)-6(j) are sectional views schematically showing structures obtained in different steps in a flow of manufacturing a semiconductor device according to a still further embodiment of the present disclosure.

As shown in FIG. 6(a), on a substrate 5000 provided is a semiconductor layer comprising a first semiconductor sub-layer 5001, a second semiconductor sub-layer 5002, a third semiconductor sub-layer 5003, and a fourth semiconductor sub-layer 5004 which are arranged on top of each other. For example, the substrate 5000 may comprise a bulk Si substrate, the semiconductor sub-layer 5001 may comprise SiGe (where the atomic percentage of Ge may be about 5-20%) with a thickness of about 2-15 nm, the semiconductor sub-layer 5002 may comprise Si with a thickness of about 20-150 nm, the semiconductor sub-layer 5003 may comprise SiGe (where the atomic percentage of Ge may be about 5-20%) with a thickness of about 1-10 nm, and the semiconductor sub-layer 5004 may comprise Si with a thickness of about 20-150 nm.

Further, an oxide layer (e.g., silicon oxide) and a nitride layer (e.g., silicon nitride), which are indicated together as "5005" in the figure, are sequentially formed on the semiconductor layer. For example, the oxide layer may have a thickness of about 2-5 nm, the nitride layer may have a thickness of about 10-50 nm. The oxide layer and the nitride layer 5005 serve as a hard mask in the subsequent processes. Further, a patterned photo resist layer 5009 may be formed on the nitride layer so that it is positioned on regions corresponding to fins to be formed.

Figure 6B:
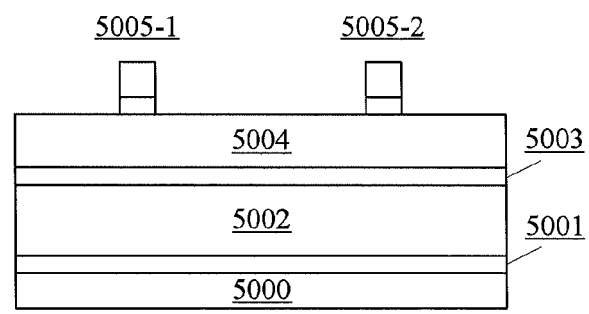

Next, as shown in FIG. 6(b), the hard mask layer 5005 can be patterned. Specifically, the nitride layer may be etched by means of, for example, Reactive Ion Etching (RIE), by using the patterned photo resist layer 5009 as a mask. The etching can be stopped on the oxide layer. After that, the oxide layer is further etched by means of, for example, RIE. The etching can be stopped on the Si sub-layer 5004. This results in the patterned hard mask layer 5005-1, 5005-2. Finally, the photo resist layer 5009 can be removed.

Figure 6C:
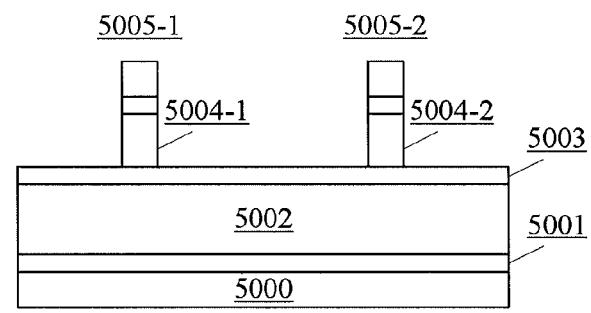
Figure 6D:
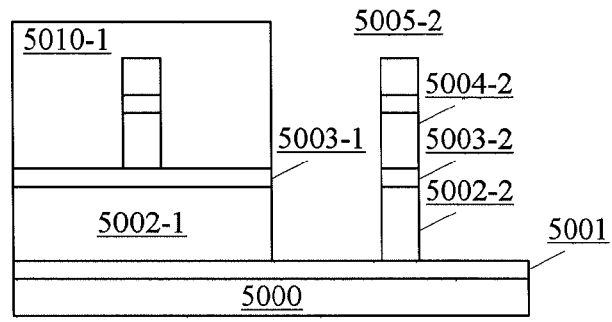

Then, as shown in FIGS. 6(c) and 6(d), the semiconductor layer can be patterned by means of, for example, RIE by using the patterned hard mask layer 5005-1, 5005-2 as a mask, resulting in fins in the semiconductor layer. Specifically, as shown in FIG. 6(c), firstly the Si sub-layer 5004 is etched selectively with respect to the SiGe sub-layer 5003, resulting in the patterned Si sub-layer 5004-1, 5004-2. The, as shown in FIG. 6(d), the region on the left side ("a first region") can be covered by a protection layer 5010-1 such as a photo resist layer, and the region on the right side ("a second region") can be further patterned. More specifically, in the second region, the SiGe sub-layer 5003 is etched selectively with respect to the Si sub-layer 5002, resulting in the patterned SiGe sub-layer 5003-2 (a portion of the SiGe sub-layer 5003 remaining in the first region is shown as 5003-1), and then the Si sub-layer 5002 is etched selectively with respect to the SiGe sub-layer 5001, resulting in the patterned Si sub-layer 5002-2 (a portion of the Si sub-layer 5002 remaining in the first region is shown as 5002-1).

Figure 6E:
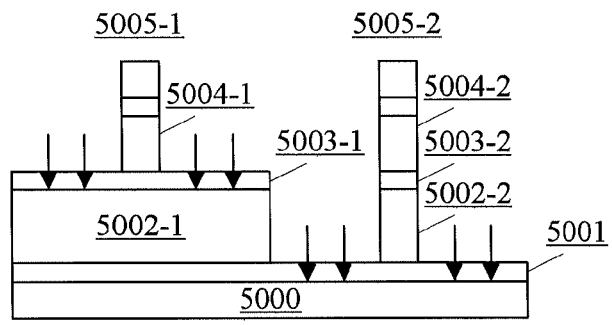

Finally, the protection layer 5010-1 can be removed, resulting in the structure shown in FIG. 6(e). As shown in FIG. 6(e), in the first region a first fin is formed, which consists of the patterned Si sub-layer 5004-1, with the hard mask layer 5005-1 on the top thereof, and in the second region a second fin is formed, which consists of the patterned Si sub-layer 5004-2, the patterned SiGe sub-layer 5003-2, and the patterned Si sub-layer 5002-2, with the hard mask layer 5005-2 on the top thereof. In this embodiment, the first fin and the second fin have their top surfaces flush with each other, but have different heights from each other. It is to be noted that the hard mask layer 5005-1, 5005-2 can be removed in the subsequent processes.

In this embodiment, the semiconductor sub-layers adjacent to each other (e.g., the Si sub-layer and the SiGe sub-layer) have different materials from each other, and have etching selectively with respect to each other. Thus, in patterning the fins, the semiconductor sub-layers can be etched on a sub-layer by sub-layer basis. As a result, it is possible to have the heights of the finally obtained fins well controlled. Specifically, in this embodiment, the first fin and the second fin comprise different numbers of the patterned semiconductor sub-layers, and thus have different heights from each other.

After the formation of the fins, ion implantation can be conducted as shown by arrows in FIG. 6(e), to implant dopants for formation of block regions into the semiconductor layer. Preferably, the implanted dopants can be of n-type for a p-type device, while p-type for an n-type device. Here, the implantation can be conducted in a direction vertical to the surface of the semiconductor layer. Due to the presence of the hard mask layer 5005-1, 5005-2 on the top of the fins, the vertical implantation will not cause the dopants implanted into the fins. Here, the implantation depth of the dopants into the semiconductor layer can be controlled by parameters in the implantation process such as implanting energy, time, dose and the like.

Figure 6F:
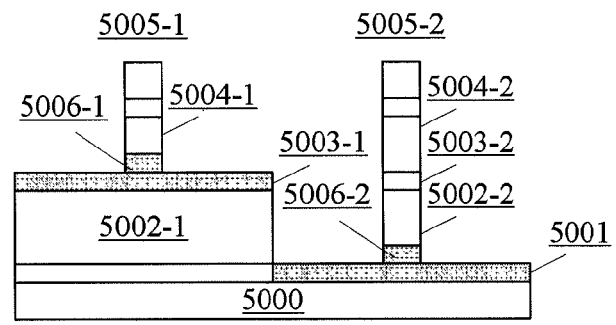

Subsequently, as shown in FIG. 6(f), the implanted dopants can be activated by means of annealing, so that the dopants can diffuse into the bottom portions of the respective fins, resulting in block regions 5006-1 and 5006-2. The obtained block regions may have a doping concentration of about $1*10^{16}$ cm$^{-3}$-$1*10^{19}$ cm$^{-3}$. It is also to be noted that the block regions may have boundaries which are not sharp. In the figure, the block regions 5006-1 and 5006-2 are shown to have straight and definite boundaries for convenience. Further, in the figure, some of the boundaries of the block regions 5006-1 and 5006-2 are shown to overlap with boundaries of the semiconductor sub-layers 5003-1 and 5001 just for convenience. However, the present disclosure is not limited thereto.

Figure 6G:
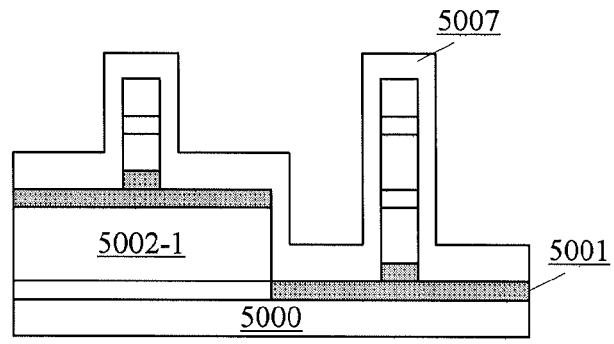
Figure 6H:
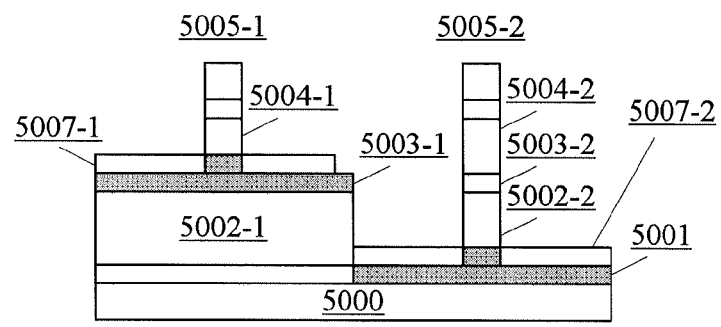

Next, as shown in FIGS. 6(g) and 6(h), an isolation layer may be formed on both sides of the respective fins on the semiconductor layer. Specifically, as shown in FIG. 6(g), firstly on the whole structure an oxide layer 5007, such as a High Density Plasma (HDP) oxide (e.g., SiO$_2$) layer, may be deposited. The oxide layer 5007 may have its bottom portion thicker and have portions on sidewalls of the respective fins thinner. Then, as shown in FIG. 6(h), the oxide layer 5007 is isotropically etched back to expose the sidewalls of the respective fins, resulting in the isolation layer 5007-1, 5007-2. Preferably, the top surface of the block region 5006-1 protrudes with respect to the top surface of the isolation layer 5007-1, and the top surface of the block region 5006-2 protrudes with respect to the top surface of the isolation layer 5007-2, as described above.

Figure 6I:
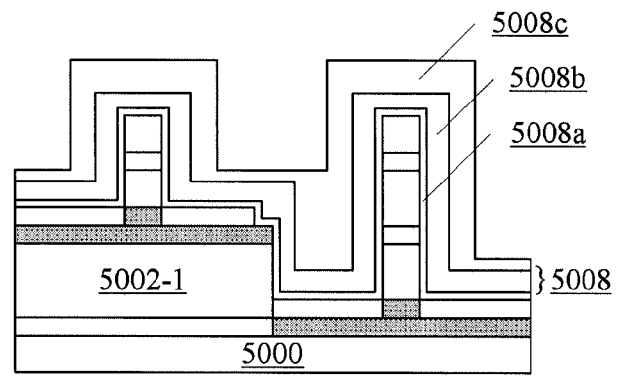

Then, as shown in FIG. 6(i), a gate dielectric layer 5008a, a work function adjustment layer 5008b, and a gate electrode layer 5008c can be formed by means of, for example, deposition, to cross over the respective fins. For example, the gate dielectric layer 5880a may comprise high-K dielectric such as HfO$_2$, HfSiO, HfSiON, HfTaO, HfTiO, HfZrO, Al$_2$O$_3$, La$_2$O$_3$, ZrO$_2$, LaAlO, and the like, with a thickness of about 2-4 nm, the work function adjustment layer 5008b may comprise TiN, TiAlN, TaN, TaAlN, TaC, and the like, and the gate electrode layer may comprise poly silicon.

Figure 6J:
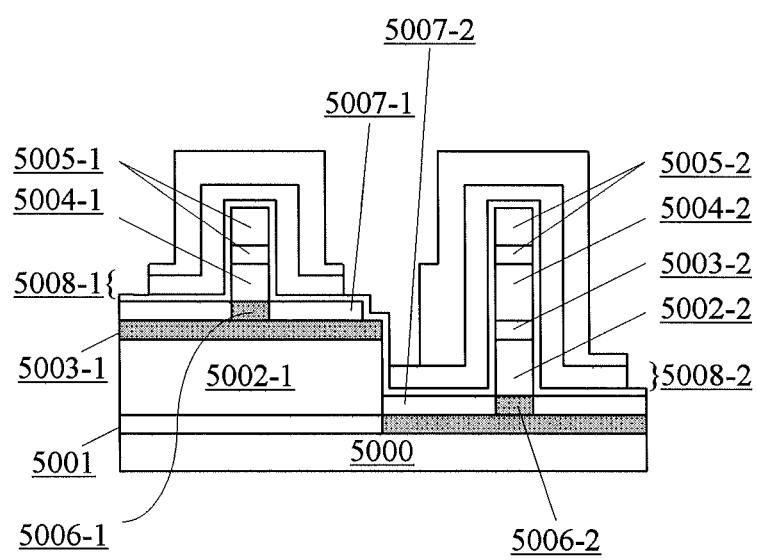

Next, as shown in FIG. 6(j), final gate stacks can be formed by patterning. Specifically, the gate electrode layer 5008c and the work function adjustment layer 5008b (and optionally the gate dielectric layer 5008a) can be etched by means of, for example, RIE, so that the respective gate stacks are electrically isolated from each other, resulting in gate stacks 5008-1 and 5008-2. After that, the process can proceed as in the conventional process for formation of source and drain regions, metal interconnection, and the like, to obtain a final device.

Thus, the semiconductor device according to this embodiment is achieved. This semiconductor device is similar in perspective view to that shown in FIG. 5 (where the specific configuration of the gate stack is not shown).

In this embodiment, the semiconductor layer comprises four semiconductor sub-layers (two fin main-body sub-layers and two corresponding etching-stop sub-layers), and are patterned to form two fins of different heights. However, the present disclosure is not limited thereto. The semiconductor layer may comprise any number of semiconductor sub-layers, and may be patterned to form any number of fins of different heights.

In the above descriptions, details of patterning and etching of the layers are not described. It is understood by those skilled in the art that various measures may be utilized to form the layers and regions in desired shapes. Further, to achieve the same feature, those skilled in the art can devise processes not entirely the same as those described above.

From the foregoing, it will be appreciated that specific embodiments of the disclosure have been described herein for purposes of illustration, but that various modifications may be made without deviating from the disclosure. Accordingly, the technology is not limited except as by the appended claims.

We claim:

1. A semiconductor device, comprising:
    a semiconductor layer;
    a fin formed by patterning the semiconductor layer; and
    a gate stack crossing over the fin,
    wherein the fin comprises a doped block region at the bottom portion thereof,
    wherein the semiconductor layer comprises a first region and a second region, and the fin comprises a first fin in the first region and a second fin in the second region,
    wherein the first fin has a height different from that of the second fin.

2. The semiconductor device according to claim 1, wherein the block region comprises n-type dopants for a p-type device, and p-type dopants for an n-type device.

3. The semiconductor device according to claim 1, further comprising an isolation layer positioned on both sides of the fin on the semiconductor layer, wherein the top surface of the block region is higher than that of the isolation layer.

4. The semiconductor device according to claim 1, wherein the semiconductor layer comprises a plurality of semiconductor sub-layers, wherein adjacent semiconductor sub-layers are made of different materials and thus have etching selectivity with respect to each other, and the first fin and the second fin comprise different numbers of the semiconductor sub-layers.

5. The semiconductor device according to claim 4, wherein the semiconductor layer comprises alternately stacked fin-body material sub-layers and etching-stop sub-layers, wherein the thickness of the fin-body material sub-layers is larger than that of the etching-stop sub-layers.

6. The semiconductor device according to claim 5, wherein the fin-body material sub-layers comprise Si, and the etching-stop sub-layers comprise SiGe.

7. A method for manufacturing a semiconductor device, comprising:
    patterning a semiconductor layer to form a fin;
    forming a doped block region at the bottom portion of the fin; and
    forming a gate stack crossing over the fin,
    wherein patterning layer to form the fin comprises:
        patterning the semiconductor layer in a first region of the semiconductor layer to form a first fin; and
        patterning the semiconductor layer in a second region of the semiconductor layer to form a second fin,
        wherein the first fin has a height different from that of the second fin.

8. The method according to claim 7, wherein the block region comprises n-type dopants for a p-type device, and p-type dopants for an n-type device.

9. The method according to claim 7, wherein forming the doped block region at the bottom portion of the fin comprises:
    implanting dopants into the semiconductor layer on both sides of the fin; and
    annealing to activate the implanted dopants so that the dopants diffuse into the bottom portion of the fin.

10. The method according to claim 7, wherein after forming the doped block region at the bottom portion of the fin, the method further comprises:
    providing an isolation layer on both sides of the fin on the semiconductor layer, wherein the top surface of the block region is higher than that of the isolation layer.

11. The method according to claim 7, wherein
    the semiconductor layer comprises a plurality of semiconductor sub-layers, wherein adjacent semiconductor sub-layers are made of different materials, so that the adjacent semiconductor sub-layers have etching selectivity with respect to each other,
    patterning the semiconductor layer in the first region comprises patterning the semiconductor layer to form the first fin from a first number of the semiconductor sub-layers; and
    patterning the semiconductor layer in the second region comprises patterning the semiconductor layer to form the second fin from a second number of the semiconductor sub-layers, wherein the second number is different from the first number.

12. The method according to claim 11, wherein the semiconductor layer comprises alternately stacked fin-body material sub-layers and etching-stop sub-layers, wherein the thickness of the fin-body material sub-layers are larger than that of the etching-stop sub-layers.

13. The method according to claim 12, wherein the fin-body material sub-layers comprise Si, and the etching-stop sub-layers comprise SiGe.

* * * * *